United States Patent
Wei et al.

(10) Patent No.: US 9,806,731 B2
(45) Date of Patent: Oct. 31, 2017

(54) SIGNAL CALIBRATION CIRCUIT AND SIGNAL CALIBRATION DEVICE

(71) Applicant: MediaTek Singapore Pte. Ltd., Singapore (SG)

(72) Inventors: Cwei Wei, Chaohu (CN); Yang Zhang, FuCheng Township, Fengyang County (CN)

(73) Assignee: MEDIATEK SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/459,112

(22) Filed: Mar. 15, 2017

(65) Prior Publication Data
US 2017/0272090 A1   Sep. 21, 2017

(30) Foreign Application Priority Data

Mar. 15, 2016   (CN) .......................... 2016 1 0146468

(51) Int. Cl.
*H03M 1/10*   (2006.01)
*G10L 19/16*   (2013.01)

(52) U.S. Cl.
CPC ......... *H03M 1/1009* (2013.01); *G10L 19/167* (2013.01)

(58) Field of Classification Search
CPC .................................................. H03M 1/1009
USPC ................................................. 341/120–155
See application file for complete search history.

(56) References Cited

U.S. PATENT DOCUMENTS

| | | | | |
|---|---|---|---|---|
| 5,331,321 A * | 7/1994 | Mannonen | .......... | H03M 1/0692 341/110 |
| 5,861,826 A * | 1/1999 | Shu | ...... | H03M 1/1033 341/120 |
| 6,369,727 B1* | 4/2002 | Vincze | ...... | G06J 1/00 341/131 |
| 6,380,874 B1* | 4/2002 | Knudsen | ...... | H03M 3/388 341/118 |
| 6,583,741 B1* | 6/2003 | Knudsen | ...... | H03M 3/388 341/118 |
| 6,891,486 B1* | 5/2005 | Pentakota | ...... | H03M 1/109 341/120 |
| 2005/0270212 A1* | 12/2005 | Smith | ...... | H03M 1/1028 341/155 |
| 2013/0076546 A1* | 3/2013 | Wan | ...... | H03M 1/1033 341/120 |

(Continued)

*Primary Examiner* — Lam T Mai
(74) *Attorney, Agent, or Firm* — McClure, Qualey & Rodack, LLP

(57) ABSTRACT

A signal calibration circuit and a signal calibration method are provided. The signal calibration circuit includes: an analog-to-digital conversion circuit, coupled to an output terminal of the circuit to be tested, obtaining an analog signal output by the circuit to be tested and transforming the analog signal into a digital signal; a calibration signal generation circuit, generating a calibration signal, modifying the calibration signal according to a first signal, and outputting a modified calibration signal; and a calibration circuit, coupled to the analog-to-digital conversion circuit and the calibration signal generation circuit, obtaining the digital signal and the calibration signal, calibrating the digital signal according to the modified calibration signal and outputting a calibrated digital signal. The first signal is a predetermined signal or the calibrated digital signal output by the calibration circuit.

10 Claims, 7 Drawing Sheets

(56) References Cited

U.S. PATENT DOCUMENTS

2013/0169463 A1* 7/2013 Stein ................. H03M 1/12
341/155

* cited by examiner

SIGNAL CALIBRATION CIRCUIT AND SIGNAL CALIBRATION DEVICE

CROSS REFERENCE TO RELATED APPLICATIONS

This Application claims priority of China Patent Application No. 201610146468.0, filed on Mar. 15, 2016, the entirety of which is incorporated by reference herein.

BACKGROUND OF THE INVENTION

Field of the Invention

The present invention relates to signal processing, and in particular to a signal calibration circuit and a signal calibration method.

Description of the Related Art

SPDIF is the abbreviation for the Sony/Philips digital interface format. In terms of transmission, SPDIF is divided into two parts, SPDIF OUT and SPDIF IN. SPDIF OUT are supported by most sound card chipsets. However, it should be noticed that not every product is provided with a digital interface. The number of sound card chipsets support SPDIF IN (for example: EMU10K1, YMF-744, FM801-AU, CMI8738, and the like) is smaller than the number of sound card chipsets support SPDIF OUT. A typical application of SPDIF IN in a sound card chipset is CD Sony/Philips digital interface (SPDIF), but not every sound card chipset supporting SPDIF IN is equipped with such an interface.

However, when a audio signal is converted into a digital signal from an analog signal, an offset might occur for the pulses in the audio signal, this would affect the accuracy of the audio signal, and cause the distortion of the audio signal.

BRIEF SUMMARY OF THE INVENTION

Embodiments of a signal calibration circuit and a signal calibration method are provided to perform a calibration for the offset of pulse duty cycle produced during the conversion of analog signals to digital signals to prevent signal distortion during transmission.

In order to solve the above technical problem, one embodiment of the invention is provided. A signal calibration circuit for calibrating output signals of a circuit to be tested comprises: an analog-to-digital conversion circuit, coupled to an output terminal of the circuit to be tested, obtaining an analog signal output by the circuit to be tested and transforming the analog signal into a digital signal; a calibration signal generation circuit, generating a calibration signal, modifying the calibration signal according to a first signal, and outputting a modified calibration signal; and a calibration circuit, coupled to the analog-to-digital conversion circuit and the calibration signal generation circuit, obtaining the digital signal and the calibration signal, calibrating the digital signal according to the modified calibration signal and outputting a calibrated digital signal; wherein the first signal is a predetermined signal or the calibrated digital signal output by the calibration circuit. The calibration signal generation circuit comprises a first resistor string, a second resistor string, a voltage input terminal, a voltage output terminal, a reference voltage terminal, at least one first electronic switch, and at least one second electronic switch; wherein the first resistor string comprises a first terminal, a second terminal, and a plurality of first resistors connected in serial between the first terminal and the second terminal; wherein at least one terminal of at least one of the first resistors is connected to the voltage input terminal through the first electronic switch; wherein the second resistor string comprises a third terminal, a fourth terminal, and a plurality of second resistors connected in serial between the third terminal and the fourth terminal; wherein at least one terminal of at least one of the second resistors is connected to the reference voltage terminal through the second electronic switch; and the voltage output terminal is connected to the second terminal and the third terminal. Resistances of the first resistors are greater than resistances of the second resistors. The calibration signal generation circuit comprises a third resistor string; wherein the third resistor string comprises a fifth terminal, a sixth terminal, and a plurality of third resistors connected in serial between the fifth terminal and the sixth terminal; and the voltage output terminal is connected between each two adjacent third resistors. A number of the first resistors is 16, the resistance of the first resistor is a quarter of a unit resistance, two terminals of each in any two of the first resistors is connected to the first electronic switch through the voltage input terminal; wherein an number of the second resistors is 4, the resistance of the second resistor is one-sixteenth of a unit resistance, two terminals of each in any two of the second resistors is connected to the reference voltage terminal through the second electronic switch; and an number of the third resistors is 31, the resistance of the third resistor is a unit resistance, one terminal of any of the third resistors is connected to the voltage output terminal. The analog-to-digital conversion circuit comprises a capacitor, a field effect transistor, and a subtractor; wherein a first terminal of the capacitor is coupled to the output terminal of the circuit to be tested, a second terminal of the capacitor is coupled to a drain of the field effect transistor; a source of the field effect transistor is coupled to an inverting input terminal of the subtractor and a gate of the field effect transistor receives a calibration starting signal, a positive input terminal of the subtractor receives a reference signal; and an output terminal of the subtractor is coupled to the calibration circuit. The calibration circuit comprises a hysteresis comparator; wherein a first input terminal of the hysteresis comparator is coupled to the output terminal of the analog-to-digital conversion circuit, a second input terminal of the hysteresis comparator is coupled to the output terminal of the calibration signal generation circuit, and an output terminal of the hysteresis comparator is configured to output the calibrated digital signal.

In order to solve the above technical problem, another embodiment of the invention is provided. A signal calibration method for calibrating output signals of a circuit to be tested, comprises: by the analog-to-digital conversion circuit, obtaining the analog signal of the circuit to be tested and converting the analog signal into the digital signal; by the calibration signal generation circuit, generating the calibration signal, modifying the calibration signal according to the first signal and outputting the modified calibration signal; and by the calibration circuit, obtaining the digital signal and the modified calibration signal, calibrating the digital signal according to the modified calibration signal and outputting the calibrated digital signal; wherein the first signal is the predetermined signal or the calibrated digital signal output by the calibration circuit. The steps of obtaining, calibrating, and outputting performed by the calibration signal generation circuit comprise: outputting a predetermined calibration signal and checking the calibrated digital signal output by the calibration circuit; when the calibrated digital signal is at low level, modifying the calibration signal and obtaining the calibration signal while the calibrated digital signal is transiting to high from low to serve as a first calibration signal; when the calibrated digital signal is at high level, modifying the calibration signal and obtaining the calibration signal while the calibrated digital signal is transiting to low from high to serve as a second calibration signal; and outputting a third calibration signal, wherein a value of the third calibration signal is an average value of the first calibration signal and the second calibration signal. The step of modifying the calibration signal and obtaining the calibration signal while the calibrated digital signal is transiting to high from low to serve as the first calibration signal comprises: when the calibrated digital signal is at low level, amplifying a voltage of the calibration signal and obtaining the calibration signal while the calibrated digital signal is transiting to high from low to serve as the first calibration signal; wherein the step of modifying the calibration signal and obtaining the calibration signal while the calibrated digital signal is transiting to low from high to serve as the second calibration signal comprises: when the calibrated digital signal is at high level, decreasing the voltage of the calibration signal and obtaining the calibration signal while the calibrated digital signal is transiting to low from high to serve as the second calibration signal.

In contrast to prior art, in an embodiment of the present invention, an analog-to-digital conversion circuit is coupled to an output terminal of the circuit to be tested to obtain an analog signal output by the circuit to be tested and transform the analog signal into a digital signal; a calibration signal generation circuit generates a calibration signal, modifies a calibration signal according to a first signal, and outputs a modified calibration signal; a calibration circuit is coupled to the analog-to-digital conversion circuit and the calibration signal generation circuit to obtain the digital signal and the calibration signal, calibrate the digital signal according to the modified calibration signal and output a calibrated digital signal. Using the above method, the offset of pulse duty cycle produced during the conversion of analog signals to digital signals can be calibrated to prevent signal distortion during transmission. As a result, the stability of the data transmission is ensured.

DETAILED DESCRIPTION OF THE INVENTION

Figure 1:
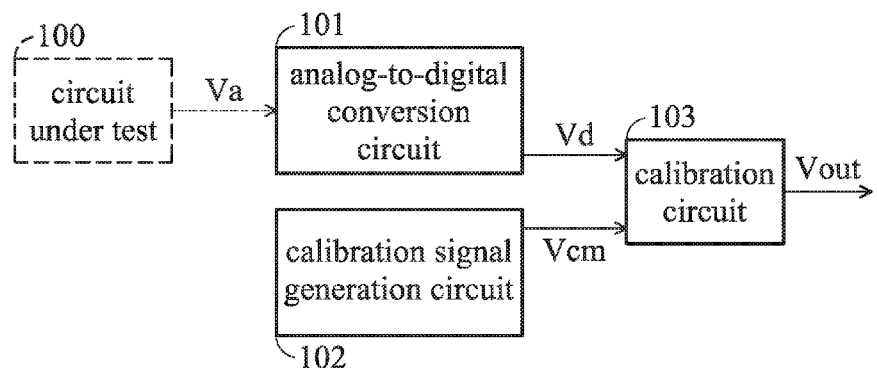
FIG. 1 is a structural schematic diagram of a first embodiment of a signal calibration circuit of the present invention.

Reference to FIG. 1, FIG. 1 is a structural schematic diagram of a first embodiment of a signal calibration circuit of the present invention. The signal calibration circuit comprises an analog-to-digital conversion circuit 101, a calibration signal generation circuit 102, and a calibration circuit 103.

The analog-to-digital conversion circuit 101 is coupled to an output terminal of a circuit to be tested (i.e., a circuit under test) 100 for obtaining an analog signal Va output from the circuit to be tested 100 and converting the analog signal Va into a digital signal Vd.

The calibration circuit 103 of the present invention is generally configured to calibrate audio signals (for example, the audio signals compatible with SPDIF). SPDIF is the abbreviation of Sony/Philips digital interface format, and is configured to transmit the string of PCM (Pulse-code modulation) stream and the surrounding compression audio signals like Dolby Digital and dts. As a result, the most significant meaning of applying the function of SPDIF to the audio card is to make the audio card perform better expansion capabilities. For various digital audio decoders, the audio card can be connected to the computer to implement relative functions once the audio card is equipped with SPDIF IN if the audio card supports SPDIF OUT.

In another embodiment of the present invention, the calibration circuit 103 is also configured to calibrate other signals other than audio signals. These signals are always modifiable analog signals. As a result, it is needed to convert the analog signals to the digital signals before calibration. Certainly, there is no need to perform the conversion by the analog-to-digital conversion circuit 101 if the signal from the circuit to be tested is a digital signal.

Specifically, taking the SPDIF audio interface for example, the audio output in SPDIF format focuses more on the duty cycle of the pulse output of SPDIFBF. SPDIFBF (SPDIF buffer) is equivalent to the analog-to-digital conversion circuit 101 in the embodiment of the present invention and SPDIF is equivalent to the calibration circuit 103 in the embodiment of the present invention.

The calibration signal generation circuit 102 is configured to generate a calibration signal Vcm, and modify the calibration signal Vcm according to a first signal, and outputs the modified calibration signal.

In general, the first signal is a predetermined signal with a modifiable value, and the value of the predetermined signal can also be a fixed value set previously according to experience.

The calibration circuit 103, coupled to the analog-to-digital conversion circuit 101 and the calibration signal generation circuit 102, is configured to obtain the digital signal Vd and the calibration signal Vcm, and calibrate the digital signal Vd according to the calibration signal Vcm and output a calibrated signal (i.e. an output signal) Vout.

Furthermore, the calibration signal generation circuit 102 sets the calibration signal Vcm to be consistent with the first signal. The calibration signal generation circuit 102 checks the calibrated signal Vout output by the calibration circuit 103 when the analog-to-digital conversion circuit operates, and then the calibrated signal Vout can be modified again to produce a second signal, a third signal or other signal different from the first signal. Finally, the calibrated signal Vout is modified many times before becoming a more accurate first signal, thus it is more accurate for modifying the calibration signal Vcm.

Various calibration schemes can be used to calibrate the offset of the duty cycle for the digital signal Vd, it can be increasing or decreasing the duty cycle for the digital signal Vd, and it can also be adjusting the other parameters (such as the frequency and the amplitude, etc) besides the duty cycle for the digital signal Vd.

In addition, the calibration signal Vcm can be generated not only based on the predetermined standard signal mentioned above but also can be based on the calibrated signal Vout output by the calibration circuit 103. For example, modifying is continued to be performed for the calibration signal Vcm if there is still an offset to the duty cycle of the calibrated signal Vout.

Because signal distortion often takes place during transmission of the analog signal Va or during the conversion of the analog signal Va into the digital signal Vd, the duty cycle is always offseted. Namely, the duty cycle offset occurs before the signal enters SPDIF. In the present invention, the calibration for the offset is implemented in SPDIF. The calibration signal Vcm is utilized to calibrate the digital signal Vd so that the offset of the duty cycle of the digital signal Vd is decreased to get as close as possible to the ideal state. Finally, SPDIF outputs the calibrated signal Vout after the offset of the duty cycle of the digital signal Vd is decreased.

In contrast to the prior art, in an embodiment of the present invention, an analog-to-digital conversion circuit is coupled to an output terminal of the circuit to be tested to obtain an analog signal output by the circuit to be tested and transform the analog signal into a digital signal; a calibration signal generation circuit generates a calibration signal, modifies a calibration signal according to a first signal, and outputs a modified calibration signal; a calibration circuit is coupled to the analog-to-digital conversion circuit and the calibration signal generation circuit to obtain the digital signal and the calibration signal, and calibrate the digital signal according to the modified calibration signal and outputs a calibrated digital signal. Using the above method, the offset of pulse duty cycle produced during the conversion of analog signals to digital signals can be calibrated to prevent signal distortion during transmission. As a result, the stability of the data transmission is ensured.

Figure 2:
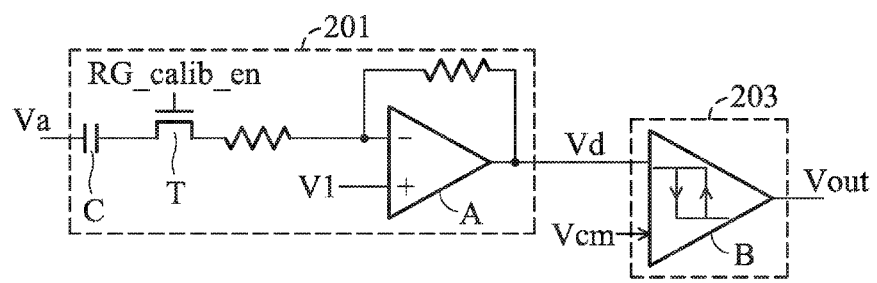
FIG. 2 is a schematic diagram of an analog-to-digital conversion circuit and a calibration circuit of a second embodiment of a signal calibration circuit of the present invention.
Figure 3:
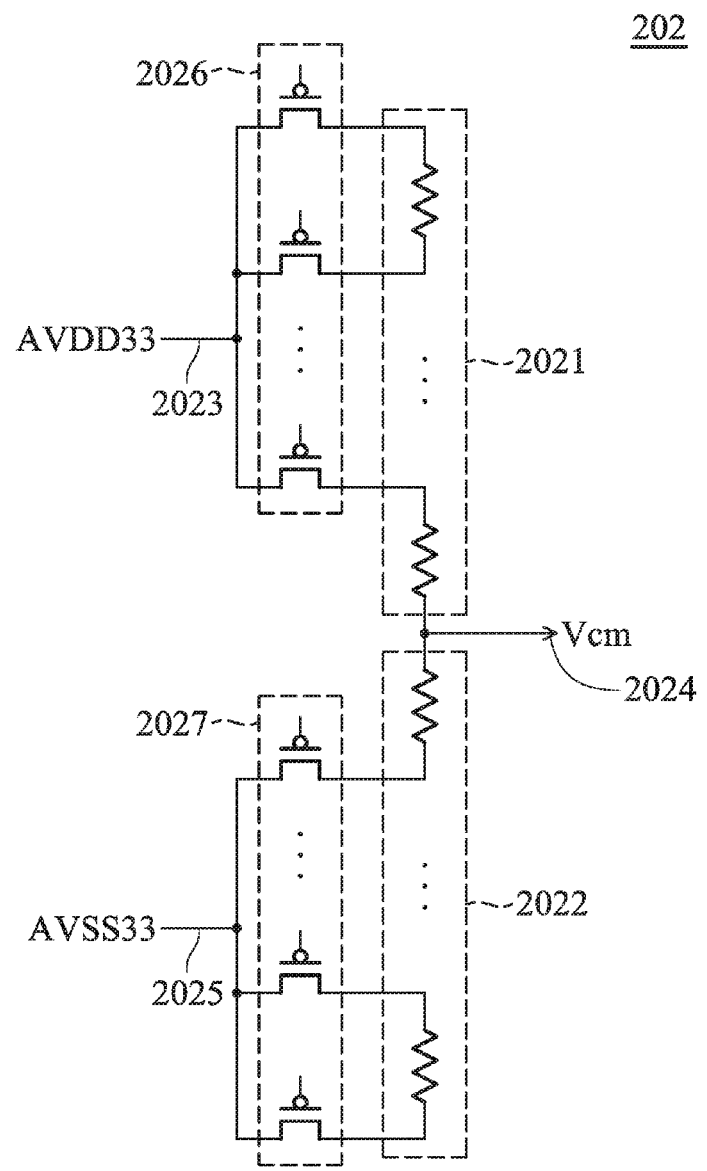
FIG. 3 is a schematic diagram of a calibration signal generation circuit of a second embodiment of a signal calibration circuit of the present invention.

Please refer to FIG. 2 and FIG. 3. FIG. 2 is a schematic diagram of an analog-to-digital conversion circuit and a calibration circuit according to a second embodiment of a signal calibration circuit of the present invention, and FIG. 3 is a schematic diagram of a calibration signal generation circuit.

The analog-to-digital conversion circuit 201 comprises a capacitor C, a field effect transistor T, and a subtractor A. A first terminal of the capacitor C is coupled to an output terminal of the circuit to be tested, a second terminal of the capacitor C is coupled to a drain of the field effect transistor T, a source of the field effect transistor T is coupled to an inverting input terminal of the subtractor A, a gate of the field effect transistor T receives a calibration starting signal RG_calib_en, a positive input terminal of the subtractor A receives a reference signal V1, and an output terminal of the subtractor A is coupled to the calibration circuit 203.

The field effect transistor T is equivalent to a switch and the calibration starting signal RG_calib_en is received by the gate of the field effect transistor T. Namely, when the calibration is started, the calibration starting signal RG_calib_en is high so that the field effect transistor T is turned on and the signal calibration circuit starts to work. In addition, an additional resistor can be placed at the inverting input terminal of the subtractor A to control the amplitude of a signal to be tested (i.e., the analog signal mentioned above) Va.

Figure 4:
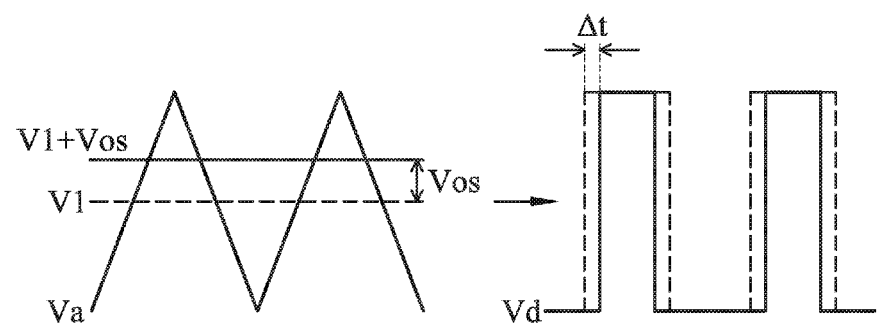
FIG. 4 is a schematic diagram of signal variation of Va-Vd of a second embodiment of a signal calibration circuit of the present invention.

Please refer to FIG. 2 and FIG. 4. The signal to be tested Va is an analog signal corresponding to an input signal at the inverting input terminal of the subtractor A. The signal V1 is a reference signal corresponding to an input signal at the positive input terminal of the subtractor A.

The subtractor is arranged to subtract the signal at the positive input terminal of the subtractor from the inverting input terminal at the subtractor to obtain the difference (V1−Va). The output terminal of the subtractor A outputs 1 (high level) if the difference (V1−Va) is a positive number and the output terminal of the subtractor A outputs 0 (low level) if the difference (V1−Va) is a negative number. Based on such operations, the analog signal can be converted to the digital signal.

In an ideal situation, the signal V1 is fixed. The signal to be tested Va varies because the signal to be tested Va is an analog signal. The subtractor A outputs low level when the signal V1 is higher than the signal to be tested Va and the subtractor A outputs high level when the signal V1 is lower than the signal to be tested Va. Namely, the output waveform of the subtractor A should be the pulse waveform of the dashed line on the right side in FIG. 4 because the amplitude of the signal V1 is half of the amplitude of the signal to be tested Va. As a result, an ideal duty cycle of a digital signal Vd (the pulse signal output by the subtractor A) is equal to 50%.

However, in a real situation, the subtractor A has an offset and the value of the signal V1 of the subtractor A is greater than the value in the ideal situation, and the value of the signal V1 of the subtractor A becomes (V1+Vos). Thus, the duty cycle of the digital signal Vd is less than 50%, and the duty cycle of the digital signal Vd is the pulse waveform of solid line on the right side in FIG. 4. Namely, the width of the pulse of the real waveform is narrower by 2Δt than the width of the pulse of the ideal waveform, wherein Δt is the time difference between the rising edge of the ideal pulse and the rising edge of the real pulse rise in FIG. 4.

The calibration signal generation circuit 202 comprises a first resistor string 2021, a second resistor string 2022, a voltage input terminal 2023, a voltage output terminal 2024, a reference voltage terminal 2025, at least one first electronic switch 2026, and at least one second electronic switch 2027.

The first resistor string 2021 comprises a first terminal, a second terminal, and a plurality of first resistors connected in serial between the first terminal and the second terminal. At least one terminal of at least one of the first resistors is connected to the voltage input terminal through the first electronic switch. The second resistor string 2022 comprises a third terminal, a fourth terminal, and a plurality of second resistors connected in serial between the third terminal and the fourth terminal. At least one terminal of at least one of the second resistors is connected to the reference voltage terminal through the second electronic switch. The voltage output terminal is connected with the second terminal and the fourth terminal.

Specifically, the first resistor string 2021 is the plurality of first resistors connected in serial between the first terminal and the second terminal and the second resistor string 2022 is the plurality of second resistors connected in serial between the third terminal and the fourth terminal, wherein the numbers and the resistances of the first resistors and the second resistors could be set arbitrarily. In one embodiment of the present invention, the resistances of the first resistors can be equal to the resistances of the second resistors, and the number of the first resistors is equal to the number of the second resistors.

A node between every two first resistors is connected to the input voltage terminal through a first electronic switch, and a node between every two second resistors is connected to the reference voltage terminal through a second electronic switch. Using the above method, the number of the first resistors connected in series between the voltage input terminal 2023 and the voltage output terminal 2024 can be modified by controlling turning on and off the plurality of first electronic switches (modifying the resistance) and the number of the second resistors connected in series between the reference voltage terminal 205 and the voltage output terminal 2024 can be modified through controlling turning on and off the plurality of second electronic switches. As a result, the calibration signal Vcm output by the voltage output terminal 2024 varies based on a certain rule. It should be realized that the calibration signal Vcm output by the voltage output terminal with smaller variation is more accurate in each modification when the number of the first resistors and the second resistors is larger. On the contrary, it is known that the calibration signal Vcm output by the voltage output terminal having larger variation is less accurate when the number of the first resistors and the second resistors is smaller.

The calibration circuit 203 comprises a hysteresis comparator B, a first input terminal of the hysteresis comparator B is coupled to the output terminal of the analog-to-digital conversion circuit 201, a second input terminal of the hysteresis comparator B is coupled to the output terminal of the calibration signal generation circuit 202, an output terminal of the hysteresis comparator B is configured to output the calibrated signal.

Figure 5:
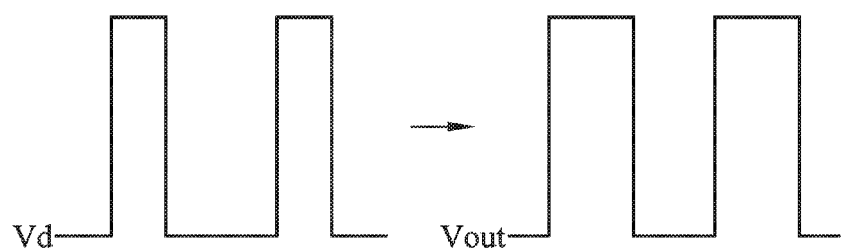
FIG. 5 is a schematic diagram of signal variation of Vd-Vout of a second embodiment of a signal calibration circuit of the present invention.

As shown in FIG. 5, the digital signal Vd of the subtractor A is input to the first input terminal of the hysteresis comparator B, and the calibration signal Vcm of the calibration signal generation circuit 202 is input to the second input terminal of the hysteresis comparator B.

The hysteresis comparator can control the hysteresis of the first input terminal to increase the duty cycle of the impulse signal according to the value of the signal of the second input terminal.

If the calibration signal Vcm is in the ideal situation, the duty cycle of the pulse of the digital signal Vd is calibrated after the digital signal Vd and the calibration signal Vcm pass through the calibration circuit 203. Usually, the calibration is performed for several times before an ideal output signal Vout is obtained.

In some embodiments, an inverter can be placed in the calibration circuit, the input terminal of the inverter is coupled to the output terminal of the hysteresis comparator, and the output terminal of the inverter is configured to the output the calibrated signal.

Figure 6:
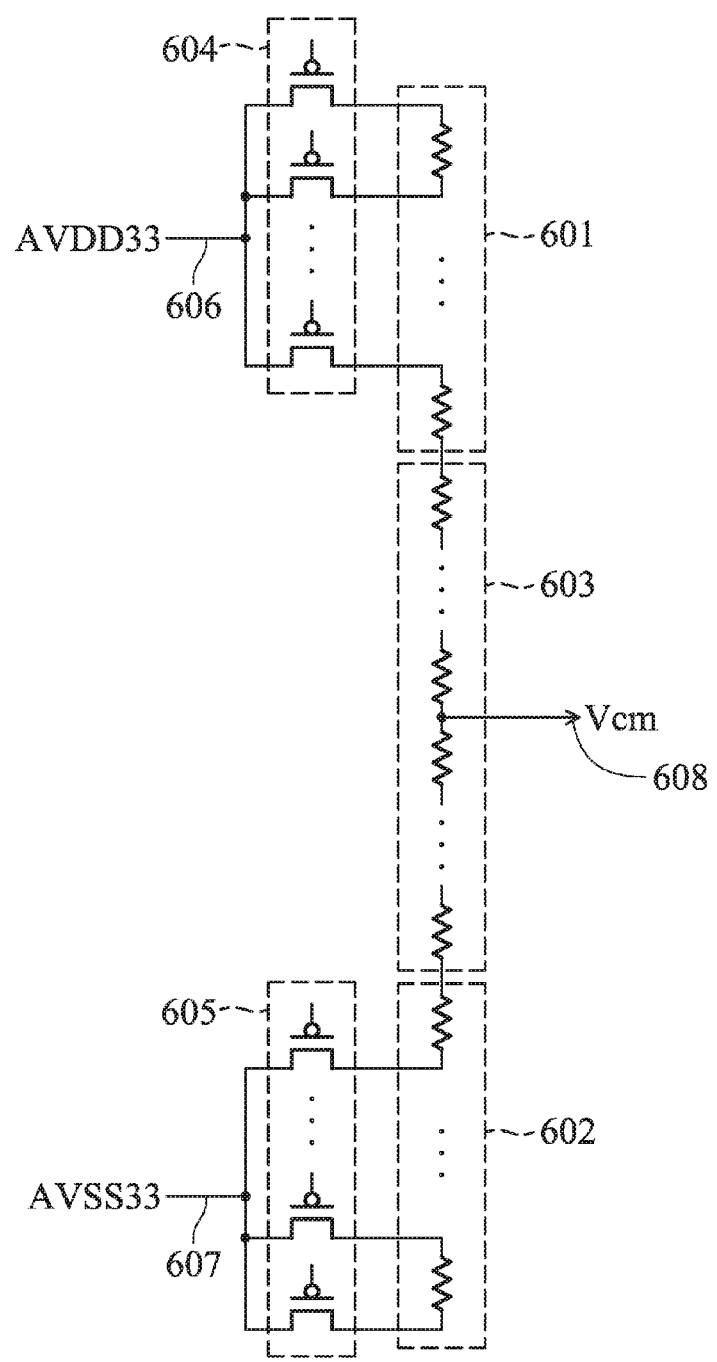
FIG. 6 is a schematic diagram of a calibration signal generation circuit of a second embodiment of a signal calibration method of the present invention.

FIG. 6 is a schematic diagram of a calibration signal generation circuit of a second embodiment of a signal calibration method of the present invention.

The difference between this embodiment and the embodiments above is the calibration signal generation circuit. In this embodiment, the calibration signal generation circuit comprises a first resistor string 601, a second resistor string 602, and a third resistor string 603. The third resistor string 603 comprises a fifth terminal, a sixth terminal, and a plurality of third resistors connected in serial between the fifth terminal and the sixth terminal and the voltage output terminal 608 is connected between each two adjacent third resistors.

The fifth terminal of the third resistor string 603 is connected to the second terminal of the first resistor string 601, and the sixth terminal of the third resistor string 603 is connected to the fourth terminal of the second resistor string 602.

Specifically, the number of the first resistors is 16, the resistance of the first resistor is a quarter of a unit resistance, in any two of the first resistors, two terminals of each first resistor are connected to the first electronic switch through the voltage input terminal; wherein the number of the second resistors is 4, the resistance of the second resistor is one-sixteenth of a unit resistance, in any two of the second resistors, two terminals of each second resistor are connected to the reference voltage terminal through the second electronic switch; and the number of the third resistors is 31, the resistance of the third resistor is a unit resistance, one terminal of any of the third resistors is connected to the voltage output terminal.

If AVDD is 3.3V and AVSS is −3.3V, the voltage across the calibration signal generation circuit is 6.6V. The voltage of the calibration signal generation circuit can be decreased and output from the third resistor string 603 through the voltage division of the first resistor string, the second resistor string, and the third resistor string. The number of the serial resistors between the first resistor string 601 and the second resistor string 602 can be modified by modifying the first electronic switch 604 or the second electronic switch 605, in order to modify the voltage of the calibration signal generation circuit.

Specifically, the position of the voltage output terminal 608 is located between the seventeenth resistor and the eighteenth resistor in the third resistor string 603 counting from the sixth terminal to the fifth terminal.

From the connection relationship of the circuit, the resistance between the first terminal of the first resistor string 601 and the voltage output terminal 608 is $\frac{1}{4}R*X+R*18$, wherein X is the number of the first resistors of the first resistor string 601.

The resistance between the fourth terminal of the second resistor string 602 and the voltage output terminal 608 is $\frac{1}{16}R*Y+R*13$, wherein Y is the number of the second resistor of the second resistor string 602.

As a result, the voltage output by the voltage output terminal 608 is $Vcm=6.6*(\frac{1}{4}R*X+R*18)/(\frac{1}{4}R*X+R*31+\frac{1}{16}R*Y)-3.3$. For example, if X=3 and Y=4, Vcm≈0.567V. For example, if X=8 and Y=2, Vcm≈0.685V.

The first resistor string are for coarse tuning because the resistance of the first resistor string is greater, and the second resistor string are for fine-tuning because the resistance of the second resistor string is smaller. Namely, the number of the first resistors can be modified first, and the number of the second resistors can be modified when the error becomes smaller.

In the embodiment of the present invention, the numbers and the resistances of the first resistor string 601, the second resistor string 602, and the third resistor string 603 can be set according to the real situation. The above embodiments are only examples and do not mean to limit the scope of the present invention.

In contrast to the prior art, in an embodiment of the present invention, an analog-to-digital conversion circuit is coupled to an output terminal of the circuit to be tested to obtain an analog signal output by the circuit to be tested and transform the analog signal into a digital signal; a calibration signal generation circuit generates a calibration signal, modifies a calibration signal according to a first signal, and outputs a modified calibration signal; a calibration circuit is coupled to the analog-to-digital conversion circuit and the calibration signal generation circuit to obtain the digital signal and the calibration signal, calibrate the digital signal according to the modified calibration signal and output a calibrated digital signal. The calibration generation circuit divides the voltage through the plurality of serial resistors and controls the number of the serial resistors by the electronic switches, it can modify the produced calibration signal in both coarse tuning and fine tuning, so that the variation range of the generated calibration signal is large and the accuracy of the modification of the generated calibration signal is high.

Figure 7:
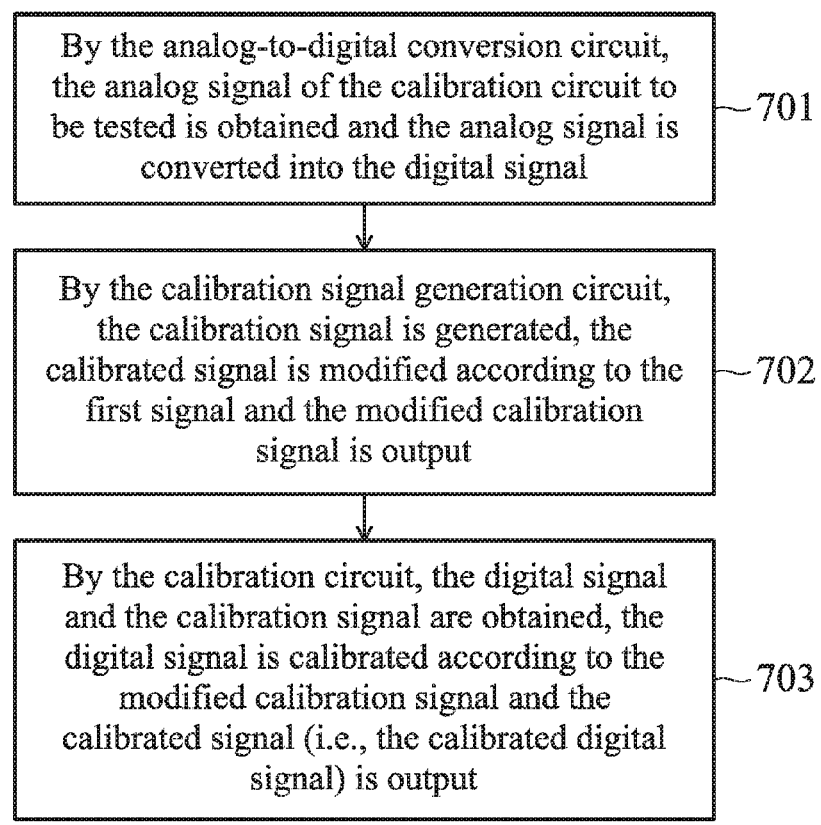
FIG. 7 is a flow chart of an embodiment of a signal calibration method of the present invention.

FIG. 7 is a flow chart of an embodiment of a signal calibration method of the present invention. The signal calibration method comprises the following steps:

In step S701, the analog signal of the calibration circuit to be tested is obtained and the analog signal is converted into the digital signal by the analog-to-digital conversion circuit.

In step S702, the calibration signal is generated, the calibrated signal is modified according to the first signal, and the modified calibration signal is output by the calibration signal generation circuit.

In step S703, the digital signal and the calibration signal are obtained, the digital signal is calibrated according to the modified calibration signal, and the calibrated signal (i.e., the calibrated digital signal) is output by the calibration circuit.

The first signal is a predetermined signal or a calibrated signal (i.e., the calibrated digital signal) output by the calibration circuit.

Specifically, step S702 comprises the following sub steps:

In step S7021, a predetermined calibration signal is output and the calibrated signal output by the calibration circuit is checked.

In step S7022, when the calibrated signal is low, the calibration signal is modified and the calibration signal is obtained while the calibrated signal is transiting from low level to high level to serve as a first calibration signal.

Specifically, step S7022 comprises: when the calibrated signal is at low level, the voltage of the calibration signal is amplified and the calibration signal is obtained while the calibrated signal is transiting from low to high to serve as the first calibration signal.

In step S7023, when the calibrated signal is at high level, the calibration signal is modified and the calibration signal is obtained while the calibrated signal is transiting from high to low to serve as a second calibration signal.

When the calibrated signal is at high level the voltage of the calibration signal is decreased and the calibration signal is obtained while the calibrated signal is transiting from high to low to serve as the second calibration signal.

In step S7024, a third calibration signal is output, wherein the value of the third calibration signal is the average value of the first calibration signal and the second calibration signal.

Figure 8:
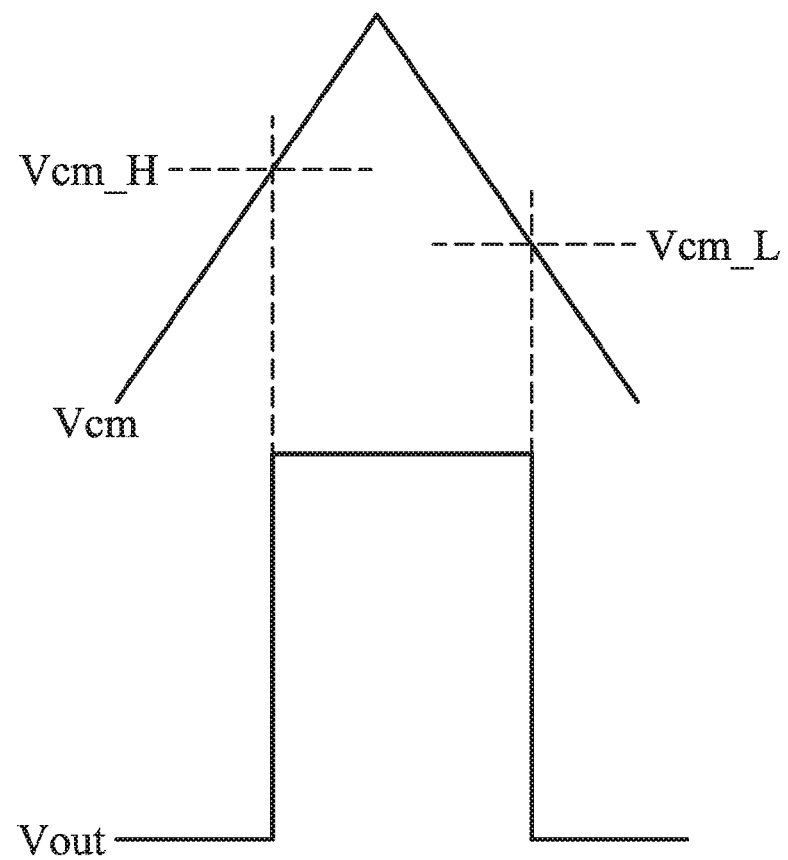
FIG. 8 is a wave schematic diagram of step S702 of an embodiment of a signal calibration method of the present invention.
Figure 9:
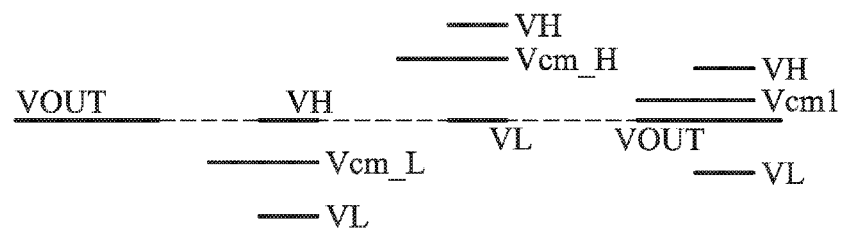
FIG. 9 is a wave comparison schematic diagram of step S702 of an embodiment of a signal calibration method of the present invention.

As shown in FIG. 8 and FIG. 9, when the calibrated signal Vout is at low level, the voltage of the calibration signal Vcm is amplified and the calibration signal Vcm is obtained while the calibrated signal Vout is transiting from low to high to serve as the first calibration signal Vcm_H. When the calibrated signal Vout is at high level, the voltage of the calibration signal Vcm is decreased and the calibration signal Vcm is obtained while the calibrated signal Vout is transiting from high to low to serve as the second calibration signal Vcm_L. The average value of the first calibration signal Vcm_H and the second calibration signal Vcm_L is used as the value of the third calibration signal Vcm1, and the value of the third calibration signal Vcm1 is output. Namely, the calibration signal output by the calibration signal generation circuit Vcm1=Vcm_H+Vcm_L)/2.

The calibration signal Vcm1 is close to the output signal Vout from FIG. 9.

In contrast to the prior art, in an embodiment of the present invention, an analog-to-digital conversion circuit is coupled to an output terminal of the circuit to be tested to obtain an analog signal output by the circuit to be tested and transform the analog signal into a digital signal; a calibration signal generation circuit generates a calibration signal, modifies a calibration signal according to a first signal, and outputs a modified calibration signal; a calibration circuit is coupled to the analog-to-digital conversion circuit and the calibration signal generation circuit to obtain the digital signal and the calibration signal, calibrate the digital signal according to the modified calibration signal and output a calibrated digital signal. A signal calibration method is configured to perform a calibration modification for the offset of the impulse duty cycle produced during the procedure for transmitting analog signals to digital signals to prevent the signal from distortion during the transmission procedure. As a result, the stability of the data transmission is ensured.

Figure 10:
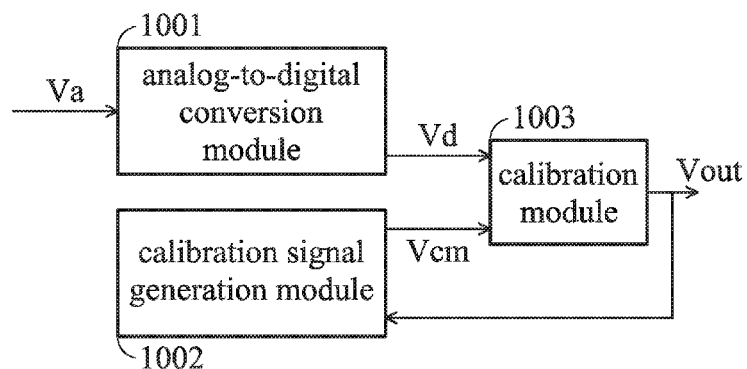
FIG. 10 is a structural schematic diagram of an embodiment of a signal calibration system of the present invention.

FIG. 10 is a structural schematic diagram of an embodiment of a signal calibration system of the present invention. The signal calibration system comprises an analog-to-digital conversion module 1001, a calibration signal generation module 1002, and a calibration module 1003.

The analog-to-digital conversion module 1001 is configured to obtain an analog signal Va of the calibration circuit to be tested and is configured to convert the analog signal Va into a digital signal Vd.

The calibration signal generation module 1002 is configured to generate a calibration signal Vcm, modify the calibration signal Vcm according to a first signal, and output a modified calibration signal.

The calibration module 1003 is coupled to the analog-to-digital conversion module 1001 and the calibration signal generation module 1002. The calibration module 1003 is configured to obtain the digital signal Vd and the calibration signal Vcm, calibrate the digital signal Vd according to the modified calibration signal and output a calibrated digital signal Vout.

In addition, the calibration signal generation module 1002 is configured to obtain the calibrated signal Vout output by the calibration module 1003 and is configured to modify the calibration signal Vcm according to the calibrated signal Vout so that the signal calibration is more accurate and the deviation of the signal calibration is decreased.

Although embodiments of the present disclosure and their advantages have been described in detail, it should be understood that various changes, substitutions and alterations can be made herein without departing from the spirit and scope of the disclosure as defined by the appended claims.

What is claimed is:

1. A signal calibration circuit for calibrating output signals of a circuit to be tested, comprising:
    an analog-to-digital conversion circuit, coupled to an output terminal of the circuit to be tested, obtaining an analog signal output by the circuit to be tested and transforming the analog signal into a digital signal;

a calibration signal generation circuit, generating a calibration signal, modifying the calibration signal according to a first signal, and outputting a modified calibration signal; and a calibration circuit, coupled to the analog-to-digital conversion circuit and the calibration signal generation circuit, obtaining the digital signal and the calibration signal, calibrating the digital signal according to the modified calibration signal and outputting a calibrated digital signal; wherein the first signal is a predetermined signal or the calibrated digital signal output by the calibration circuit.

2. The signal calibration circuit as claimed in claim 1, wherein the calibration signal generation circuit comprises a first resistor string, a second resistor string, a voltage input terminal, a voltage output terminal, a reference voltage terminal, at least one first electronic switch, and at least one second electronic switch;

wherein the first resistor string comprises a first terminal, a second terminal, and a plurality of first resistors connected in serial between the first terminal and the second terminal; wherein at least one terminal of at least one of the first resistors is connected to the voltage input terminal through the first electronic switch;

wherein the second resistor string comprises a third terminal, a fourth terminal, and a plurality of second resistors connected in serial between the third terminal and the fourth terminal; wherein at least one terminal of at least one of the second resistors is connected to the reference voltage terminal through the second electronic switch; and the voltage output terminal is connected to the second terminal and the third terminal.

3. The signal calibration circuit as claimed in claim 2, wherein the calibration signal generation circuit comprises a third resistor string; wherein the third resistor string comprises a fifth terminal, a sixth terminal, and a plurality of third resistors connected in serial between the fifth terminal and the sixth terminal; and the voltage output terminal is connected between each two adjacent third resistors.

4. The signal calibration circuit as claimed in claim 3, wherein an number of the first resistors is 16, a resistance of the first resistors is a quarter of a unit resistance, in any two of the first resistors, two terminals of each of the first resistors are connected to the voltage input terminal through one of the first electronic switch respectively; wherein an number of the second resistors is 4, a resistance of the second resistors is one-sixteenth of a unit resistance, in any two of the second resistors, two terminals of each of the second resistors are connected to the reference voltage terminal through the second electronic switch respectively; and an number of the third resistors is 31, a resistance of the third resistors is a unit resistance, one terminal of any of the third resistors is connected to the voltage output terminal.

5. The signal calibration circuit as claimed in claim 1, wherein the resistance of any of the first resistors is greater than the resistance of any of the second resistors.

6. The signal calibration circuit as claimed in claim 1, wherein the analog-to-digital conversion circuit comprises a capacitor, a field effect transistor, and a subtractor;

wherein a first terminal of the capacitor is coupled to the output terminal of the circuit to be tested, a second terminal of the capacitor is coupled to a drain of the field effect transistor;

a source of the field effect transistor is coupled to an inverting input terminal of the subtractor and a gate of the field effect transistor receives a calibration starting signal; and a positive input terminal of the subtractor receives a reference signal, an output terminal of the subtractor is coupled to the calibration circuit.

7. The signal calibration circuit as claimed in claim 1, wherein the calibration circuit comprises a hysteresis comparator;

wherein a first input terminal of the hysteresis comparator is coupled to the output terminal of the analog-to-digital conversion circuit, a second input terminal of the hysteresis comparator is coupled to the output terminal of the calibration signal generation circuit, and an output terminal of the hysteresis comparator is configured to output the calibrated digital signal.

8. A signal calibration method applied for signal calibration circuit as claimed in claim 1, comprising:

by the analog-to-digital conversion circuit, obtaining the analog signal of the circuit to be tested and converting the analog signal into the digital signal;

by the calibration signal generation circuit, generating the calibration signal, modifying the calibration signal according to the first signal and outputting the modified calibration signal; and by the calibration circuit, obtaining the digital signal and the modified calibration signal, calibrating the digital signal according to the modified calibration signal and outputting the calibrated digital signal; wherein the first signal is the predetermined signal or the calibrated digital signal output by the calibration circuit.

9. The signal calibration method as claimed in claim 8, wherein the steps of obtaining, calibrating, and outputting performed by the calibration signal generation circuit comprise:

outputting a predetermined calibration signal and checking the calibrated digital signal output by the calibration circuit;

when the calibrated digital signal is at low level, modifying the calibration signal and obtaining the calibration signal while the calibrated digital signal is transiting to high level from low level to serve as a first calibration signal;

when the calibrated digital signal is at high level, modifying the calibration signal and obtaining the calibration signal while the calibrated digital signal is transiting to low level from high level to serve as a second calibration signal; and outputting a third calibration signal, wherein a value of the third calibration signal is an average value of the first calibration signal and the second calibration signal.

10. The signal calibration method as claimed in claim 9, wherein the step of modifying the calibration signal and obtaining the calibration signal while the calibrated digital signal is transiting to high level from low level to serve as the first calibration signal comprises:

when the calibrated digital signal is at low level, amplifying a voltage of the calibration signal and obtaining the calibration signal while the calibrated digital signal is transiting to high level from low level to serve as the first calibration signal;

wherein the step of modifying the calibration signal and obtaining the calibration signal while the calibrated digital signal is transiting to low level from high level to serve as the second calibration signal comprises:

when the calibrated digital signal is at high level, decreasing the voltage of the calibration signal and obtaining the calibration signal while the calibrated digital signal is transiting to low level from high level to serve as the second calibration signal.

\* \* \* \* \*